(12) United States Patent
Wi et al.

(10) Patent No.: US 12,166,154 B2
(45) Date of Patent: Dec. 10, 2024

(54) DISPLAY DEVICE EMPLOYING SEMICONDUCTOR LIGHT-EMITTING ELEMENT AND MANUFACTURING METHOD THEREFOR

(71) Applicant: LG ELECTRONICS INC., Seoul (KR)

(72) Inventors: Kyoungtae Wi, Seoul (KR); Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 253 days.

(21) Appl. No.: 17/257,686

(22) PCT Filed: Sep. 27, 2018

(86) PCT No.: PCT/KR2018/011354
§ 371 (c)(1),
(2) Date: Jan. 4, 2021

(87) PCT Pub. No.: WO2020/009275
PCT Pub. Date: Jan. 9, 2020

(65) Prior Publication Data
US 2022/0123175 A1    Apr. 21, 2022

(30) Foreign Application Priority Data

Jul. 5, 2018   (KR) .................. 10-2018-0078340

(51) Int. Cl.
*H01L 33/38* (2010.01)
*H01L 25/075* (2006.01)
(Continued)

(52) U.S. Cl.
CPC ........ *H01L 33/382* (2013.01); *H01L 25/0753* (2013.01); *H01L 33/12* (2013.01);
(Continued)

(58) Field of Classification Search
CPC .................. H01L 33/382; H01L 25/0753
See application file for complete search history.

(56) References Cited

U.S. PATENT DOCUMENTS

| 5,903,056 A * | 5/1999 | Canning | ................. H01L 24/83 257/E21.511 |
| 7,750,469 B2 * | 7/2010 | Cho | ....................... H01L 24/12 257/E23.021 |

(Continued)

FOREIGN PATENT DOCUMENTS

| JP | 2008-84701 A | 4/2008 |
| JP | 2010-123780 A | 6/2010 |

(Continued)

*Primary Examiner* — Tuan A Hoang
(74) *Attorney, Agent, or Firm* — Birch, Stewart, Kolasch & Birch, LLP

(57) ABSTRACT

Discussed is a display device, including a substrate, a wiring electrode disposed on the substrate, a plurality of semiconductor light-emitting elements electrically connected to the wiring electrode, an anisotropic conductive layer disposed between the plurality of semiconductor light-emitting elements and formed of a mixture of conductive particles and an insulating material; and a buffer portion disposed on a lower surface of a semiconductor light-emitting element of the plurality of semiconductor light-emitting elements so as to allow the wiring electrode and the semiconductor light-emitting element to be spaced apart by a predetermined distance, and provided with at least one hole, wherein the mixture of the conductive particles and the insulating material is disposed inside the at least one hole, and the wiring electrode is electrically connected to the semiconductor light-emitting element through conductive particles disposed inside the at least one hole.

19 Claims, 10 Drawing Sheets

(51) Int. Cl.
*H01L 33/12* (2010.01)
*H01L 33/62* (2010.01)
*G09F 9/30* (2006.01)

(52) U.S. Cl.
CPC .............. *H01L 33/62* (2013.01); *G09F 9/301* (2013.01); *H01L 2933/0016* (2013.01); *H01L 2933/0066* (2013.01)

(56) References Cited

U.S. PATENT DOCUMENTS

| | | | |
|---|---|---|---|
| 2004/0159836 A1* | 8/2004 | Sugimoto | H01L 29/452 257/E29.144 |
| 2016/0181477 A1* | 6/2016 | Lee | H01L 33/42 257/98 |
| 2017/0117257 A1* | 4/2017 | Lee | H01L 33/0093 |
| 2018/0240937 A1* | 8/2018 | Park | H05K 1/111 |
| 2019/0172990 A1* | 6/2019 | Harada | H01L 25/0753 |

FOREIGN PATENT DOCUMENTS

| | | | | |
|---|---|---|---|---|
| KR | 10-2010-0075215 A | 7/2010 | | |
| KR | 10-2017-0124323 A | 11/2017 | | |
| KR | 10-2018-0055549 A | 5/2018 | | |
| WO | WO-2017034268 A1 * | 3/2017 | ............... | F21K 9/20 |

* cited by examiner

DISPLAY DEVICE EMPLOYING SEMICONDUCTOR LIGHT-EMITTING ELEMENT AND MANUFACTURING METHOD THEREFOR

CROSS REFERENCE TO RELATED APPLICATIONS

This application is the National Stage filing under 35 U.S.C. 371 of International Application No. PCT/KR2018/011354, filed on Sep. 27, 2018, which claims the benefit of earlier filing date and right of priority to Korean Patent Application No. 10-2018-0078340, filed on Jul. 5, 2018, the entire contents of all these application are expressly incorporated by reference into the present application.

BACKGROUND

1. Technical Field

The present disclosure relates to a display device and a manufacturing method thereof, and more particularly, to a flexible display device using a semiconductor light-emitting element.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light-emitting diodes (AMOLEDs).

However, there exist problems such as not-so-fast response time, difficult implementation of flexibility in case of LCDs, and there exist drawbacks such as short life span, not-so-good yield as well as weakness in flexibility in case of AMOLEDs.

On the other hand, light-emitting diodes (LEDs) are well known light-emitting elements for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting elements may be used to implement a flexible display, thereby presenting a scheme for solving the problems.

The semiconductor light-emitting element is transferred onto a substrate in various ways. As one of methods of transferring semiconductor light-emitting elements, a transfer method using an anisotropic conductive layer is used. The use of an anisotropic conductive layer has an advantage capable of electrically connecting a semiconductor light-emitting element and a wiring electrode only by thermal compression, but there is a problem that contact failure between the semiconductor light-emitting element and the wiring electrode occurs when an area of the wiring board is increased.

SUMMARY

An aspect of the present disclosure is to provide a structure for preventing the occurrence of contact failure between a semiconductor light-emitting element and a wiring electrode when the semiconductor light-emitting is element is compressed to the wiring electrode using an anisotropic conductive layer, and a manufacturing method thereof.

In order to achieve the objectives of the present disclosure, there is provided a display device, including a substrate, a wiring electrode disposed on the substrate, a plurality of semiconductor light-emitting elements electrically connected to the wiring electrode, an anisotropic conductive layer disposed between the semiconductor light-emitting elements and formed of a mixture of conductive particles and an insulating material, and a buffer portion disposed on a lower surface of the semiconductor light-emitting element so as to allow the wiring electrode and the semiconductor light-emitting element to be spaced apart by a predetermined distance, and provided with at least one hole, wherein a mixture of the conductive particles and the insulating material is disposed inside the at least one hole, and the wiring electrode is electrically connected to the semiconductor light-emitting element through conductive particles disposed inside the hole.

According to an embodiment, the at least one hole may be disposed to overlap with a lower surface of the semiconductor light-emitting element.

According to an embodiment, the buffer portion may further include a protruding portion extending from one end in a thickness direction of the semiconductor light-emitting element, and disposed on a side surface of the semiconductor light-emitting element.

According to an embodiment, the protruding portion may be formed of a light-transmitting material.

According to an embodiment, the protruding portion may be formed of a white material.

According to an embodiment, the wiring electrode may consist of a plurality of line electrodes arranged parallel to each other, and the buffer portion may be disposed along each of the line electrodes.

In a display device according to the present disclosure, when a semiconductor light-emitting element is thermally compressed onto a wiring board, conductive particles may be confined in a hole formed in a buffer portion, thereby preventing the conductive particles from being separated between the semiconductor light-emitting element and the wiring electrode. Through this, the present disclosure may prevent contact failure between the semiconductor light-emitting element and the wiring electrode.

Furthermore, according to the present disclosure, when the semiconductor light-emitting element is thermally compressed onto the wiring board, the buffer portion may maintain a constant distance between the semiconductor light-emitting element and the wiring electrode, thereby allowing pressure to be uniformly applied to each of the semiconductor light-emitting elements.

DETAILED DESCRIPTION OF THE EMBODIMENTS

Figure 1:
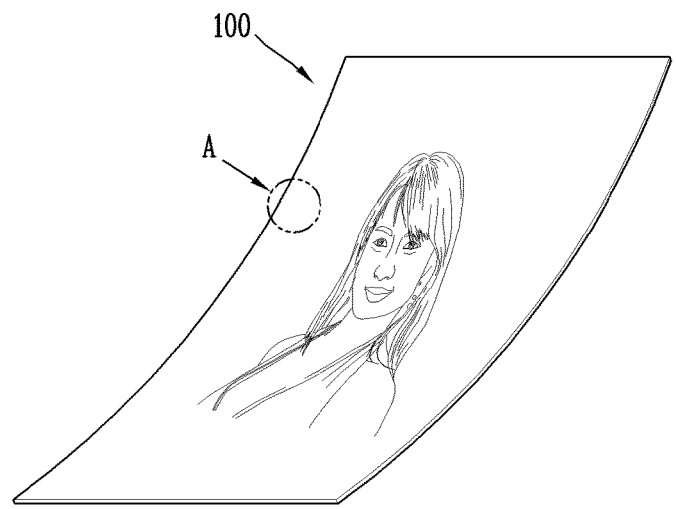
FIG. 1 is a conceptual view showing a display device using a semiconductor light-emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display device using a semiconductor light-emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display manufactured on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light-emitting element. According to the present disclosure, a light-emitting diode (LED) is illustrated as a type of semiconductor light-emitting element. The light-emitting diode may be formed with a small size to perform the role of a sub-pixel even in the second configuration through this.

Hereinafter, a flexible display implemented using the light-emitting diode will be described in more detail with reference to the accompanying drawings.

Figure 2:
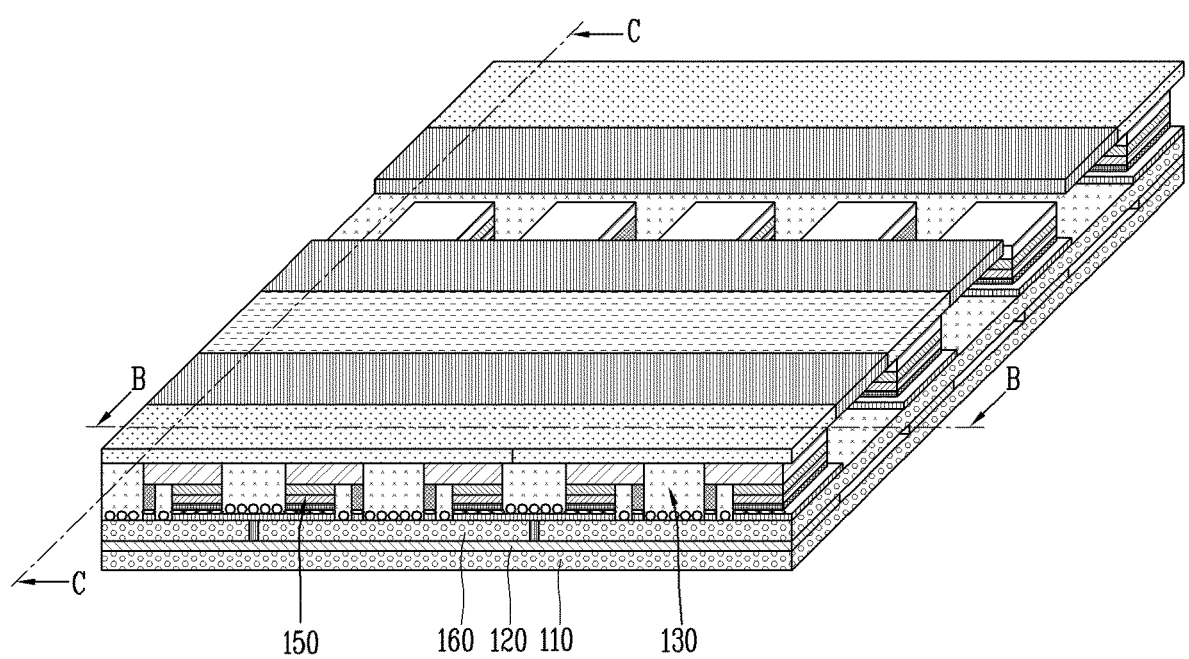
FIG. 2 is a partial enlarged view of portion "A" in FIG. 1, and FIGS. 3A and 3B are cross-sectional views taken along lines B-B and C-C in FIG. 2.
Figure 3A:
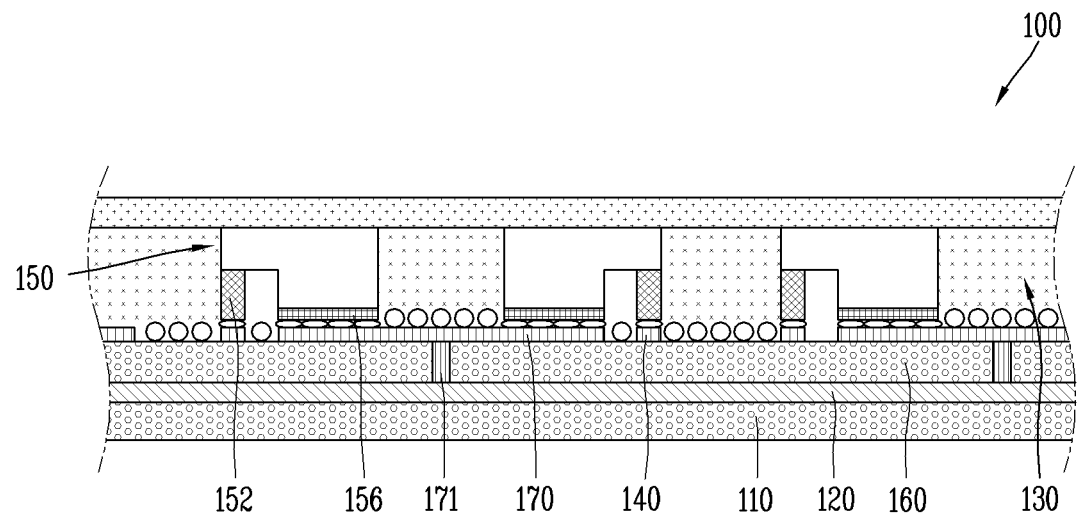
Figure 3B:
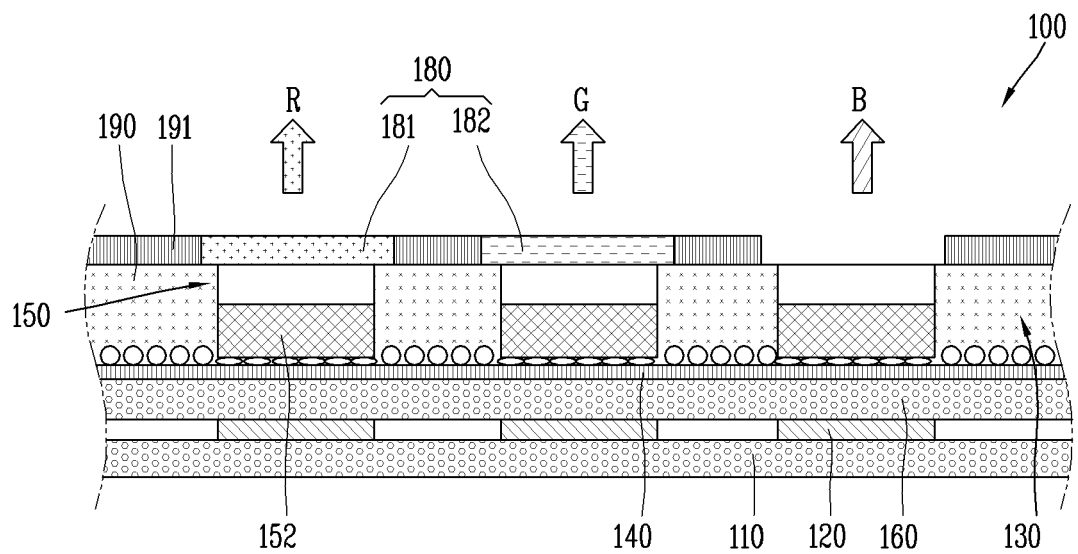
Figure 4:
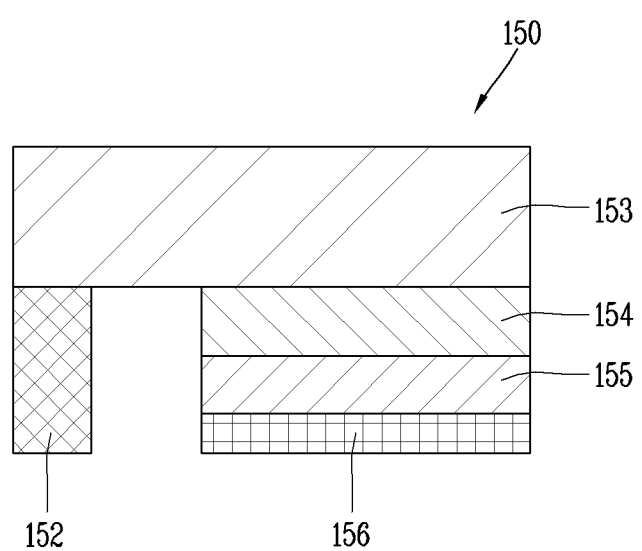
FIG. 4 is a conceptual view showing a flip-chip type semiconductor light-emitting element in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting element in FIG. 3A, and FIGS. 5A through 5C are conceptual views illustrating various forms for implementing colors in connection with a flip-chip type semiconductor light-emitting element.

According to the drawings in FIGS. 2, 3A and 3B, there is illustrated a display device 100 using a passive matrix (PM) type semiconductor light-emitting element as a display device 100 using a semiconductor light-emitting element. However, an example described below may also be applicable to an active matrix (AM) type semiconductor light-emitting element.

The display device 100 may include a substrate 110, a first electrode 120, a conductive adhesive layer 130, a second electrode 140, and a plurality of semiconductor light-emitting elements 150.

The substrate 110 may be a flexible substrate. The substrate 110 may contain glass or polyimide (PI) to implement the flexible display device. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light-emitting element 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting element 150 is connect thereto in a flip chip form with the application of heat and pressure, the semiconductor light-emitting element 150 is electrically connected to the first electrode 120 and second electrode 140.

Referring to FIG. 4, the semiconductor light-emitting element may be a flip chip type semiconductor light-emitting element.

For example, the semiconductor light-emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting elements 150. For example, the left and right p-type electrodes of the semiconductor light-emitting elements around the auxiliary electrode may be electrically connected to one auxiliary electrode.

More specifically, the semiconductor light-emitting element 150 is pressed into the conductive adhesive layer 130, and through this, only a portion between the p-type electrode 156 and auxiliary electrode 170 of the semiconductor light-emitting element 150 and a portion between the n-type electrode 152 and second electrode 140 of the semiconductor light-emitting element 150 have conductivity, and the remaining portion does not have conductivity since there is no push-down of the semiconductor light-emitting element. As described above, the conductive adhesive layer 130 may form an electrical connection as well as allow a mutual coupling between the semiconductor light-emitting element 150 and the auxiliary electrode 170 and between the semiconductor light-emitting element 150 and the second electrode 140.

Furthermore, a plurality of semiconductor light-emitting elements 150 constitute a light-emitting array, and a phosphor layer 180 is formed on the light-emitting array.

The light-emitting element array may include a plurality of semiconductor light-emitting elements with different self-luminance values. Each of the semiconductor light-emitting elements 150 constitutes a sub-pixel, and is electrically connected to the first electrode 120. For example, there may exist a plurality of first electrodes 120, and the semiconductor light-emitting elements are arranged in several rows, for instance, and each row of the semiconductor light-emitting elements may be electrically connected to any one of the plurality of first electrodes.

Furthermore, the semiconductor light-emitting elements may be connected in a flip chip form, and thus semiconductor light-emitting elements grown on a transparent dielectric substrate. Furthermore, the semiconductor light-emitting elements may be nitride semiconductor light-emitting elements, for instance. The semiconductor light-emitting element 150 may have excellent luminance characteristics, and thus it may be possible to configure individual sub-pixels even with a small size thereof.

According to the drawing, a partition wall 190 may be formed between the semiconductor light-emitting elements 150. The semiconductor light-emitting element 150 may have excellent luminance characteristics, and thus it may be possible to configure individual sub-pixels even with a small size thereof. For example, a base member of the anisotropic conductive film may form the partition wall when the semiconductor light-emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light-emitting element 150. For example, the semiconductor light-emitting element 150 is a blue semiconductor light-emitting element that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting element 151 at a position implementing a red sub-pixel, and a green phosphor 182 capable of converting blue light into green (G) light may be deposited on the blue semiconductor light-emitting element 151 at a position implementing a green sub-pixel. Furthermore, only the blue semiconductor light-emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting element 150 may be combined with quantum dot (QD) instead of phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
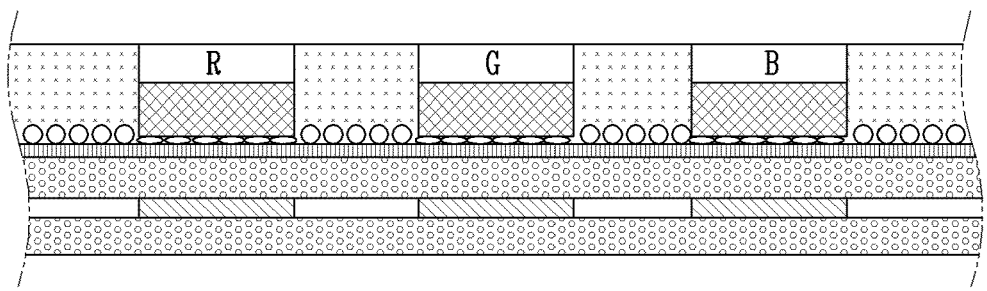
FIGS. 5A through 5C are conceptual views showing various forms for implementing colors in connection with a flip-chip type semiconductor light-emitting element.

Referring to FIG. 5A, each of the semiconductor light-emitting elements 150 may be implemented with a high-power light-emitting element that emits various lights including blue in which gallium nitride (GaN) is mostly used, and indium (In) and or aluminum (Al) are added thereto.

In this case, the semiconductor light-emitting element 150 may be red, green and blue semiconductor light-emitting elements, respectively, to implement each sub-pixel. For instance, red, green and blue semiconductor light-emitting elements (R, G, B) are alternately disposed, and red, green and blue sub-pixels implement one pixel by means of the red, green and blue semiconductor light-emitting elements, thereby implementing a full color display.

Figure 5B:
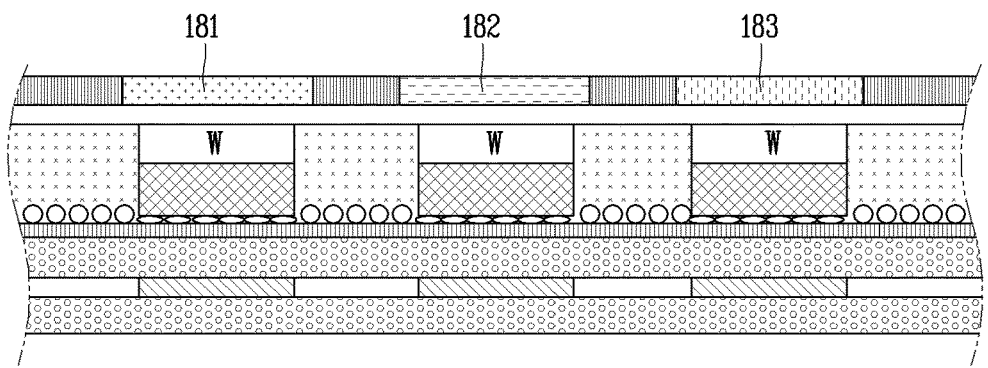

Referring to FIG. 5B, the semiconductor light-emitting element may have a white light-emitting element (VV) provided with a yellow phosphor layer for each element. In this case, a red phosphor layer 181, a green phosphor layer 182 and blue phosphor layer 183 may be provided on the white light-emitting element (W) to implement a sub-pixel. Furthermore, a color filter repeated with red, green and blue on the white light-emitting element (W) may be used to implement a sub-pixel.

Figure 5C:
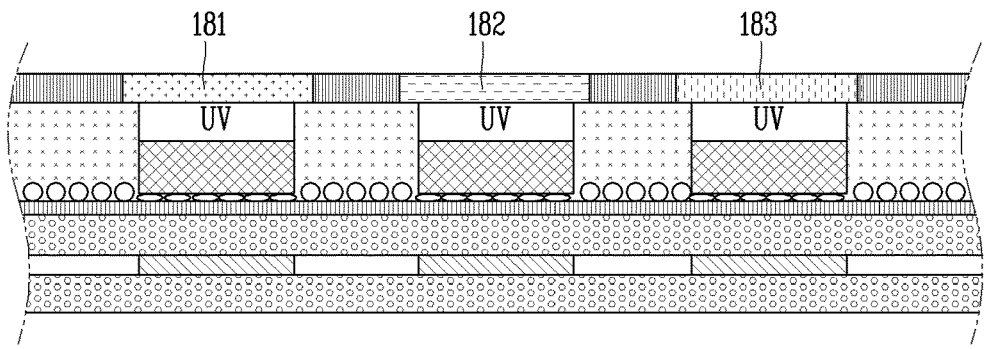

Referring to FIG. 5C, it may be possible to also have a structure in which a red phosphor layer 181, a green phosphor layer 182 and blue phosphor layer 183 may be provided on a ultra violet light-emitting element (UV). In this manner, the semiconductor light-emitting element can be used over the entire region up to ultra violet (UV) as well as visible light, and may be extended to a form of semiconductor light-emitting element in which ultra violet (UV) can be used as an excitation source.

Taking the present example into consideration again, the semiconductor light-emitting element 150 is placed on the conductive adhesive layer 130 to constitute a sub-pixel in the display device. The semiconductor light-emitting element 150 may have excellent luminance characteristics, and thus it may be possible to configure individual sub-pixels even with a small size thereof. The size of the individual semiconductor light-emitting element 150 may be less than 80 μm in the length of one side thereof, and formed with a rectangular or square shaped element. In case of a rectangular shaped element, the size thereof may be less than 20×80 μm.

Furthermore, even when a square shaped semiconductor light-emitting element 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light-emitting elements becomes sufficiently large. Accordingly, in this case, it may be possible to implement a flexible display device having a HD image quality.

A display device using the foregoing semiconductor light-emitting element will be manufactured by a new type of manufacturing method. Hereinafter, the manufacturing method will be described with reference to FIG. 6.

Figure 6:
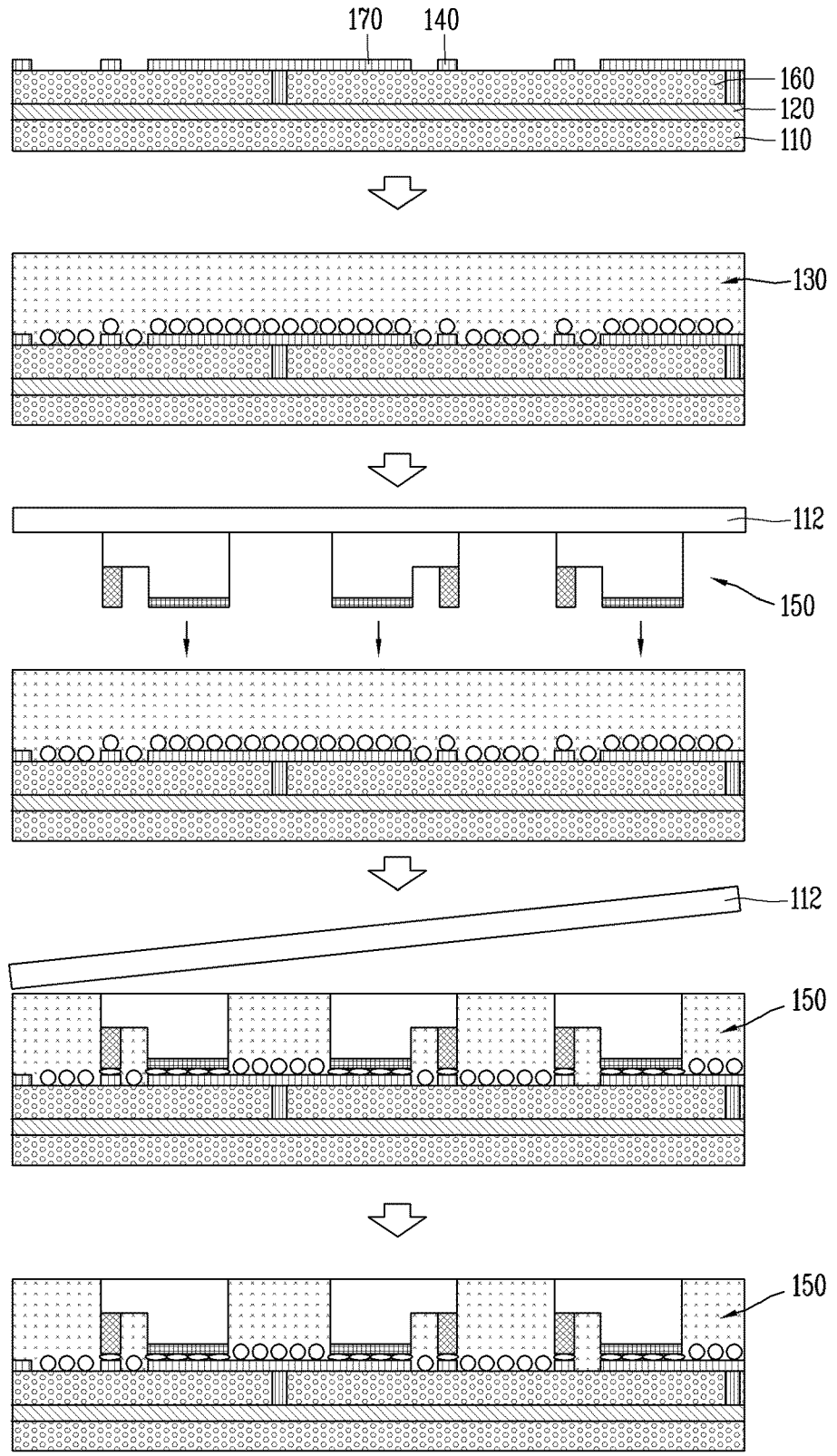
FIG. 6 is cross-sectional views showing a manufacturing method of a display device using a semiconductor light-emitting element according to the present disclosure.

FIG. 6 is cross-sectional views showing a manufacturing method of a display device using a semiconductor light-emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting elements 150 corresponding to the location of the auxiliary electrodes 170 and second electrodes 140 and constituting individual pixels is disposed such that the semiconductor light-emitting element 150 faces the auxiliary electrode 170 and second electrode 140.

In this case, the second substrate 112 as a growth substrate for growing the semiconductor light-emitting element 150 may be a sapphire substrate or silicon substrate.

The semiconductor light-emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting element 150 and the auxiliary electrode 170 and second electrode 140 may have conductivity due to the characteristics of an anisotropic conductive film having conductivity by thermal compression, thereby allowing the electrodes and semiconductor light-emitting element 150 to be electrically connected to each other. At this time, the semiconductor light-emitting element 150 may be inserted into the anisotropic conductive film, thereby forming a partition wall between the semiconductor light-emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light-emitting elements 150 to the outside. Silicon oxide (SiOx) or the like may be coated on the wiring substrate coupled to the semiconductor light-emitting element 150 to form a transparent insulating layer (not shown).

Furthermore, it may further include the process of forming a phosphor layer on one surface of the semiconductor light-emitting element 150. For example, the semiconductor light-emitting element 150 may be a blue semiconductor light-emitting element for emitting blue (B) light, and red or green phosphor for converting the blue (B) light into the color of the sub-pixel may form a layer on one surface of the blue semiconductor light-emitting element.

The manufacturing method or structure of a display device using the foregoing semiconductor light-emitting element may be modified in various forms. For such an example, the foregoing display device may be applicable to a vertical semiconductor light-emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
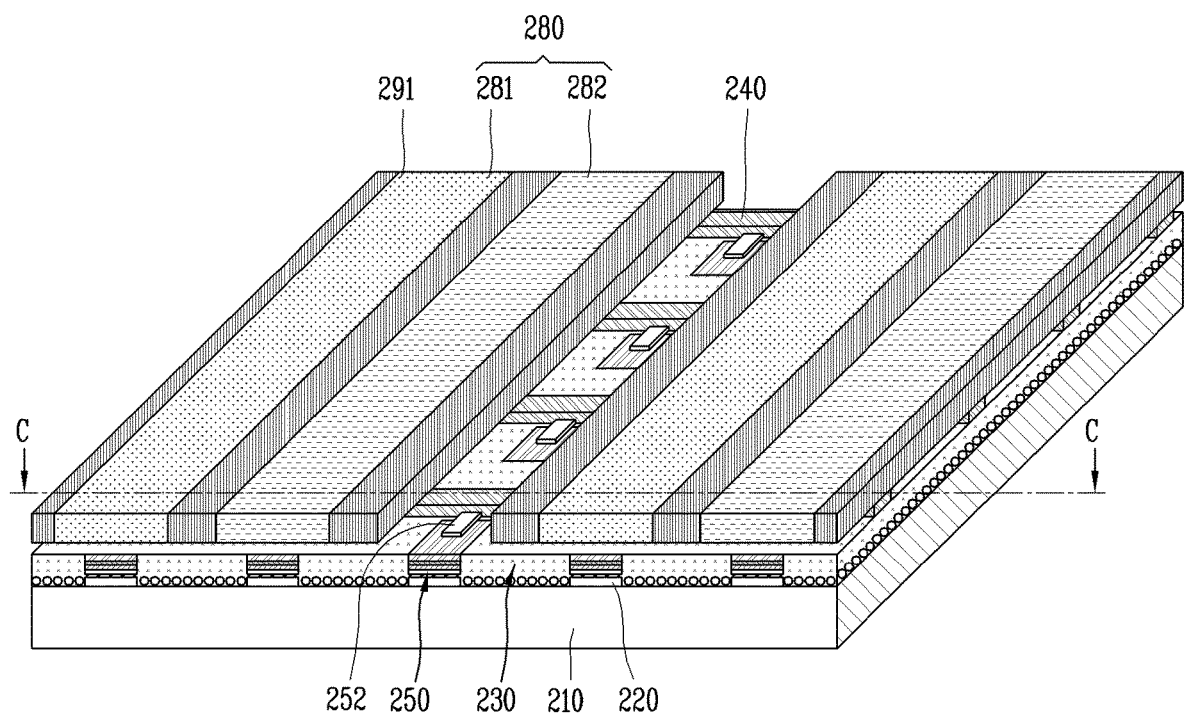
FIG. 7 is a perspective view showing a display device using a semiconductor light-emitting element according to another embodiment of the present disclosure.
Figure 8:
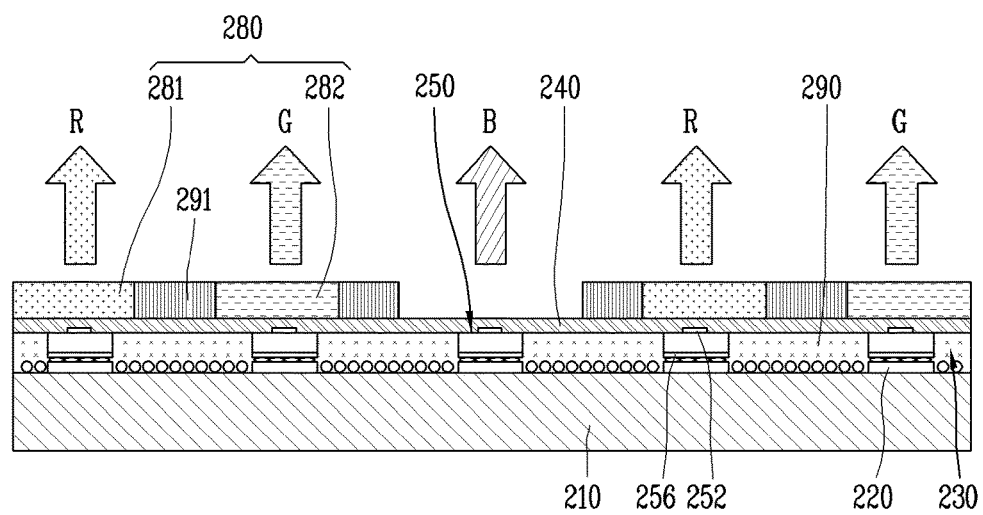
FIG. 8 is a cross-sectional view taken along line D-D in FIG. 7.
Figure 9:
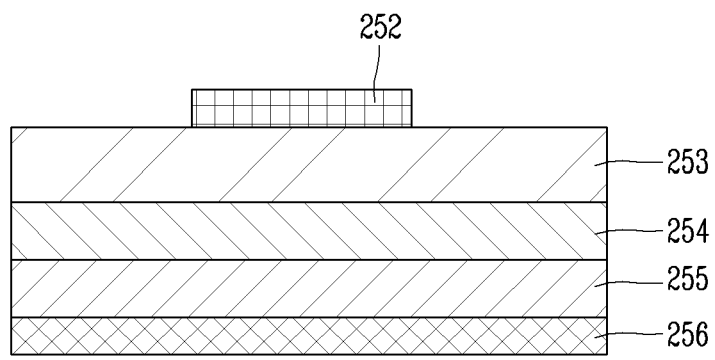
FIG. 9 is a conceptual view showing a vertical type semiconductor light-emitting element in FIG. 8.

FIG. 7 is a perspective view illustrating a display device using a semiconductor light-emitting element according to another embodiment of the present disclosure. FIG. 8 is a cross-sectional view taken along line C-C in FIG. 7, and FIG. 9 is a conceptual view illustrating a vertical type semiconductor light-emitting element in FIG. 8.

According to the drawings, the display device may be display device using a passive matrix (PM) type of vertical semiconductor light-emitting element.

The display device may include a substrate 210, a first electrode 220, a conductive adhesive layer 230, a second electrode 240 and a plurality of semiconductor light-emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light-emitting element is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting element 250 thereto, the semiconductor light-emitting element 250 is electrically connected to the first electrode 220. At this time, the semiconductor light-emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting element 250 and the first electrode 220.

In this manner, the semiconductor light-emitting element 250 is placed on the conductive adhesive layer 230, thereby configuring a separate sub-pixel in the display device. The semiconductor light-emitting element 250 may have excellent luminance characteristics, and thus it may be possible to configure individual sub-pixels even with a small size thereof. The size of the individual semiconductor light-emitting element 250 may be less than 80 µm in the length of one side thereof, and formed with a rectangular or square shaped element. In case of a rectangular shaped element, the size thereof may be less than 20×80 µm.

The semiconductor light-emitting element 250 may be a vertical structure.

A plurality of second electrodes 240 disposed in a direction of crossing the length direction of the first electrode 220, and electrically connected to the vertical semiconductor light-emitting element 250 may be located between vertical semiconductor light-emitting elements.

Referring to FIG. 9, the vertical semiconductor light-emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting element 250, thereby providing a great advantage capable of reducing the chip size.

Referring again to FIG. 8, a phosphor layer 280 may be formed on one surface of the semiconductor light-emitting element 250. For example, the semiconductor light-emitting element 250 is a blue semiconductor light-emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting element 251 at a position implementing a red sub-pixel, and a green phosphor 282 capable of converting blue light into green (G) light may be deposited on the blue semiconductor light-emitting element 251 at a position implementing a green sub-pixel. Furthermore, only the blue semiconductor light-emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light-emitting element is applied.

Taking the present embodiment into consideration again, the second electrode 240 is located between the semiconductor light-emitting elements 250, and electrically connected to the semiconductor light-emitting elements 250. For example, the semiconductor light-emitting elements 250 may be disposed in a plurality of rows, and the second electrode 240 may be located between the rows of the semiconductor light-emitting elements 250.

Since a distance between the semiconductor light-emitting elements 250 constituting individual pixels is sufficiently large, the second electrode 240 may be located between the semiconductor light-emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light-emitting element 250 by a connecting electrode protruded from the second electrode 240. More specifically, the connecting electrode may be an n-type electrode of the semiconductor light-emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting element 250, the ITO material has a problem of bad adhesiveness with an n-type semiconductor. Accordingly, the second electrode 240 may be placed between the semiconductor light-emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting elements 250. In other words, the partition wall 290 may be disposed between the vertical semiconductor light-emitting elements 250 to isolate the semiconductor light-emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display device.

If the second electrode 240 is precisely located on the conductive adhesive layer 230 between the semiconductor light-emitting elements 250, the partition wall 290 may be located between the vertical semiconductor light-emitting element 250 and second electrode 240. Accordingly, individual sub-pixels may be configured even with a small size using the semiconductor light-emitting element 250, and a distance between the semiconductor light-emitting elements 250 may be relatively sufficiently large to place the second electrode 240 between the semiconductor light-emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light-emitting element 250 is located on the conductive adhesive layer 230, thereby constituting individual pixels on the display device. The semiconductor light-emitting element 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light-emitting element.

An anisotropic conductive film (ACF) is used in a display device described above. The anisotropic conductive film (hereinafter, anisotropic conductive layer) is made of a mixture of conductive balls (hereinafter, conductive particles) and an insulating material. As described with reference to FIG. 6, when a substrate on which the semiconductor light-emitting element is formed is thermally compressed to a wiring substrate coated with an anisotropic conductive layer, the wiring electrode and the semiconductor light-emitting element are electrically connected by conductive particles.

During thermal compression, the conductive particles are compressed between the semiconductor light-emitting element and the wiring electrode to electrically connect the semiconductor light-emitting element and the wiring electrode. In order for the semiconductor light-emitting element and the wiring electrode to be electrically connected, pressure above a predetermine level must be applied to conductive particles.

Figure 10:
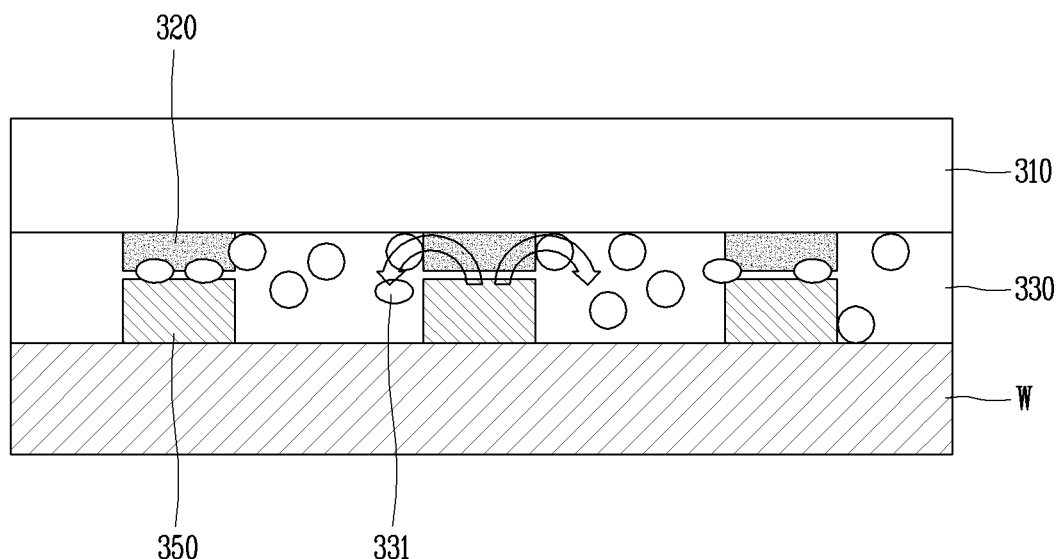
FIGS. 10 and 11 are conceptual views showing a problem occurring during the thermal compression described in FIG. 6.

Referring to FIG. 10, during thermal compression, a contact failure between the semiconductor light-emitting element 350 and the wiring electrode 320 may occur due to the fluidity of the anisotropic conductive layer 330. Specifically, during thermal compression, the conductive particles 331 must be located between the semiconductor light-emitting element 350 and the wiring electrode 320, but due to external pressure, the conductive particles 331 may move without staying in between the semiconductor light-emitting element 350 and the wiring electrode. In this case, the semiconductor light-emitting element 350 and the wiring electrode 320 are incompletely electrically connected.

Figure 11:
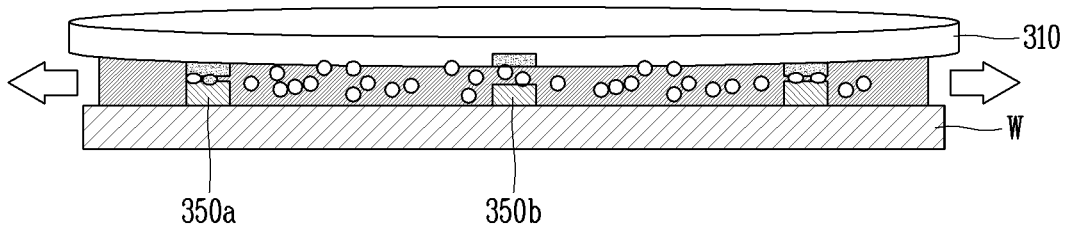

On the other hand, referring to FIG. 11, as an area of the wiring board (or a substrate) 310 increases, pressure applied to each region of the wiring board 110 during thermal compression becomes non-uniform. Specifically, when the area of the wiring board is large, relatively high pressure is applied to an edge region of the wiring board, and a relatively low pressure is applied to a central region of the wiring board. Due to this, the conductive particles are completely compressed to the wiring electrode and the semiconductor light-emitting element 350a in the edge region of the wiring board, but sufficient pressure is not applied to the conductive particles in the central region of the wiring board, thereby resulting in poor contact between the wiring electrode and the semiconductor light-emitting element 350b.

The present disclosure provides a structure of preventing conductive particles from being released between the semiconductor light-emitting element and allowing uniform pressure to be applied to an entire wiring board during the foregoing thermal compression, and a manufacturing method thereof.

First, a display device according to the present disclosure will be described.

Figure 12:
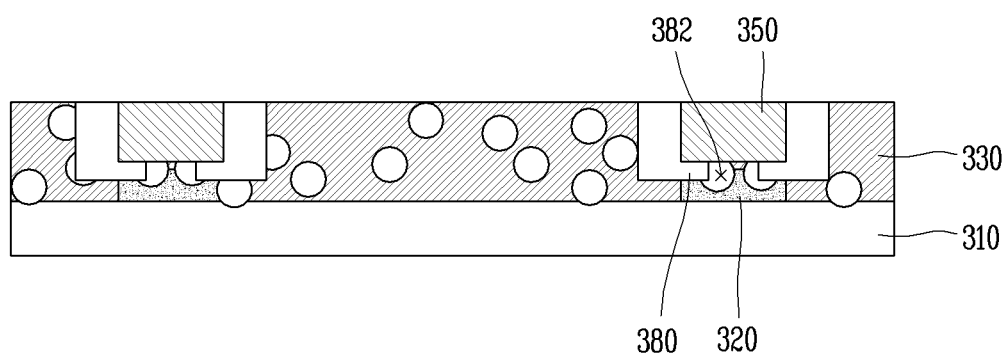
FIG. 12 is a conceptual view for explaining another embodiment of the present disclosure to which a semiconductor light-emitting element having a new structure is applied.
Figure 13:
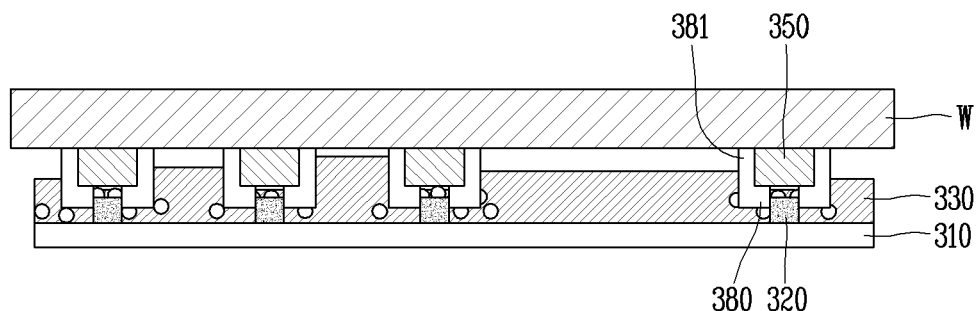
FIG. 13 is a conceptual view showing a function of a buffer portion included in the present invention.

FIG. 12 is a conceptual view showing another embodiment of the present disclosure to which a semiconductor light-emitting element having a new structure is applied, and FIG. 13 is a conceptual view showing a function of a buffer portion included in the present disclosure.

As illustrated, a display device according to the present disclosure includes a substrate (or a wiring board) 310, a wiring electrode 320, a plurality of semiconductor light-emitting elements 350, an anisotropic conductive layer 330, and a buffer portion 380. Hereinafter, each of the foregoing components will be described, and a coupling relationship between the components will be described.

The description of the substrate 310 is replaced with the description of FIGS. 1 through 9.

Meanwhile, in FIGS. 1 through 9, wiring electrodes disposed at various positions have been described, but a wiring electrode, which will be described later, refers to a wiring electrode electrically connected to a semiconductor light-emitting element by an anisotropic conductive layer. The wiring electrode may be configured as an electrode for a flip-chip type semiconductor light-emitting element, or may be configured as an electrode for the foregoing vertical semiconductor light-emitting element.

Meanwhile, the wiring electrode 320 can include a plurality of line electrodes, and the line electrodes may be arranged side by side at predetermined intervals. At least one semiconductor light-emitting element is electrically connected to each of the line electrodes.

Meanwhile, the anisotropic conductive layer 330 is made of a mixture of conductive particles and an insulating material. The anisotropic conductive layer 330 is disposed in a region of the substrate except for a region in which the semiconductor light-emitting elements 350 are disposed. Part of the anisotropic conductive layer 330 overlaps with the wiring electrode 320 or is disposed between the semiconductor light-emitting elements 350.

Meanwhile, the buffer portion 380 is disposed on a lower surface of the semiconductor light-emitting element 350. At least one hole 382 is disposed in the buffer portion 380 so as not to allow the buffer portion 380 to cover an entire lower surface of the semiconductor light-emitting element 350. The hole 382 exposes part of the lower surface of the semiconductor light-emitting element 350 to the outside to allow the semiconductor light-emitting element 350 and the wiring electrode 320 to be electrically connected.

The buffer portion 380 performs the role of confining some conductive particles included in the anisotropic conductive layer 330 between the semiconductor light-emitting element 350 and the wiring electrode during the foregoing thermal compression. Specifically, during thermal compression, the buffer portion 380 presses the anisotropic conductive layer 330 prior to the semiconductor light-emitting element 350, and at this time, part of a material forming the anisotropic conductive layer 330 flows into the hole 382 provided in the buffer portion 380. In this process, conductive particles flowing into the hole 382 are compressed to electrically connect the semiconductor light-emitting element 350 and the wiring electrode 320.

Since the conductive particles are confined by the hole 382, a density of the conductive particles may vary depending on the location of the hole 382. In order to eliminate contact failure between the semiconductor light-emitting element 350 and the wiring electrode 320, the hole 382 must be disposed to overlap with the wiring electrode 320.

Meanwhile, the buffer portion 380 may further include a protruding portion 381 extending from one end thereof in a thickness direction of the semiconductor light-emitting element 350, and disposed on a side surface of the semiconductor light-emitting element 350. When the protruding portion 381 is made of a material having a high reflectivity, light traveling to a side surface of is the semiconductor light-emitting element 350 may be reflected to increase light extraction efficiency. In one embodiment, the protruding portion 381 may be made of a white material.

On the contrary, the protruding portion 381 may be formed of a light-transmitting material. A refractive index of a material forming the protruding portion 381 may be made to be significantly different from that of the semiconductor light-emitting element, thereby inducing total reflection at a side surface of the semiconductor light-emitting element.

Meanwhile, the buffer portion 380 allows pressure to be uniformly applied to an entire wiring board during the foregoing thermal compression. To this end, the buffer portion 380 allows an anisotropic conductive layer to flow between the buffer portions 380 during thermal compression.

Specifically, the buffer portion 380 may be formed in plural, and may be disposed at a predetermined interval. During the foregoing thermal compression, the anisotropic conductive layer 330 may flow into a space formed between the buffer portions 380. Even when the anisotropic conductive layer 330 is formed somewhat unevenly as shown in FIG. 13, the present disclosure allows the anisotropic conductive layer 330 to flow between the buffer portions 380 during thermal compression, thereby preventing uneven contact from occurring between the wiring electrode 320 and the semiconductor light-emitting element 350.

On the other hand, the buffer portion 380 allows the wiring electrode 320 and the semiconductor light-emitting element 350 to approach only a predetermined distance during the foregoing thermal compression. In other words, the buffer portion 380 prevents the wiring electrode 320 and the semiconductor light-emitting element 350 from being brought close to each other within a predetermined distance due to external pressure. Through this, even when an area of the wiring board is increased, a distance between the semiconductor light-emitting element and the wiring electrode is made uniform in an entire area of the wiring board.

As described above, a buffer portion included in a display device according to the present disclosure prevents conductive particles from being released from a predetermined position during thermal compression while at the same time allowing uniform pressure to be applied to an entire substrate even when an area of the wiring board is increased.

Meanwhile, the buffer portion may have various shapes.

Figure 14A:
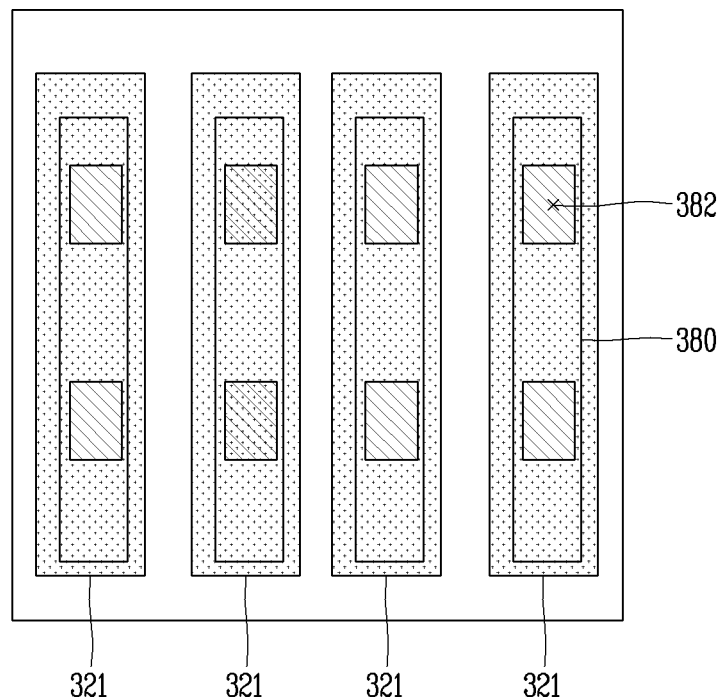
FIGS. 14A and 14B are conceptual views illustrating a modified embodiment of a buffer portion included in a display device according to the present disclosure.
Figure 14B:
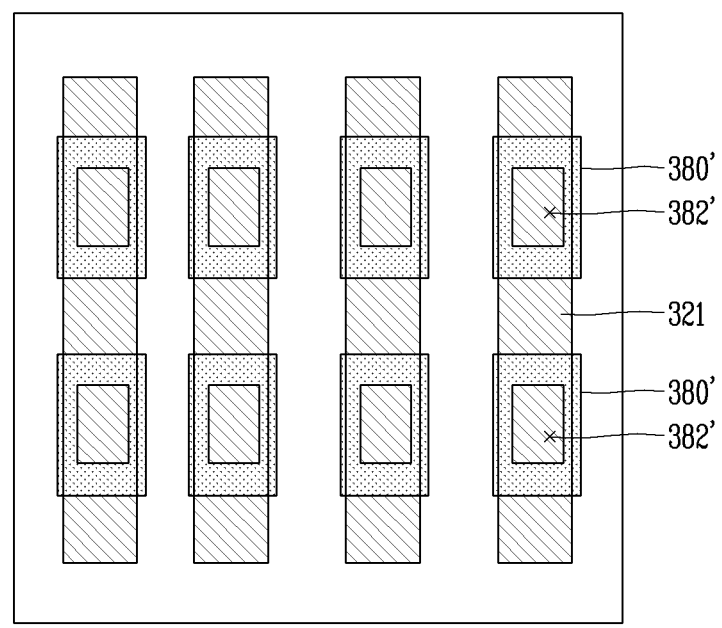

FIGS. 14A and 14B are conceptual views illustrating a modified embodiment of a buffer portion included in a display device according to the present disclosure.

FIGS. 14A and 14B are conceptual views showing the shape and relative position between each of buffer portions and wiring electrodes.

As shown in FIG. 14A, the wiring electrode may consist of line electrodes 321 arranged parallel to each other. Meanwhile, the buffer portion 380 may be formed in plural, and may be disposed along each of the line electrodes 321. At least one hole 382 provided in the buffer portion 380 exposes the wiring electrode to the outside to be electrically connected to the semiconductor light-emitting element.

Meanwhile, as shown in FIG. 14B, a plurality of buffer portions 380' and holes 382' may be disposed on one line electrode 321. The number of buffer portions 380' and holes 382' may be the same number as that of the semiconductor light-emitting elements 350.

Hereinafter, a method of manufacturing a display device using the buffer portion will be described.

Figure 15:
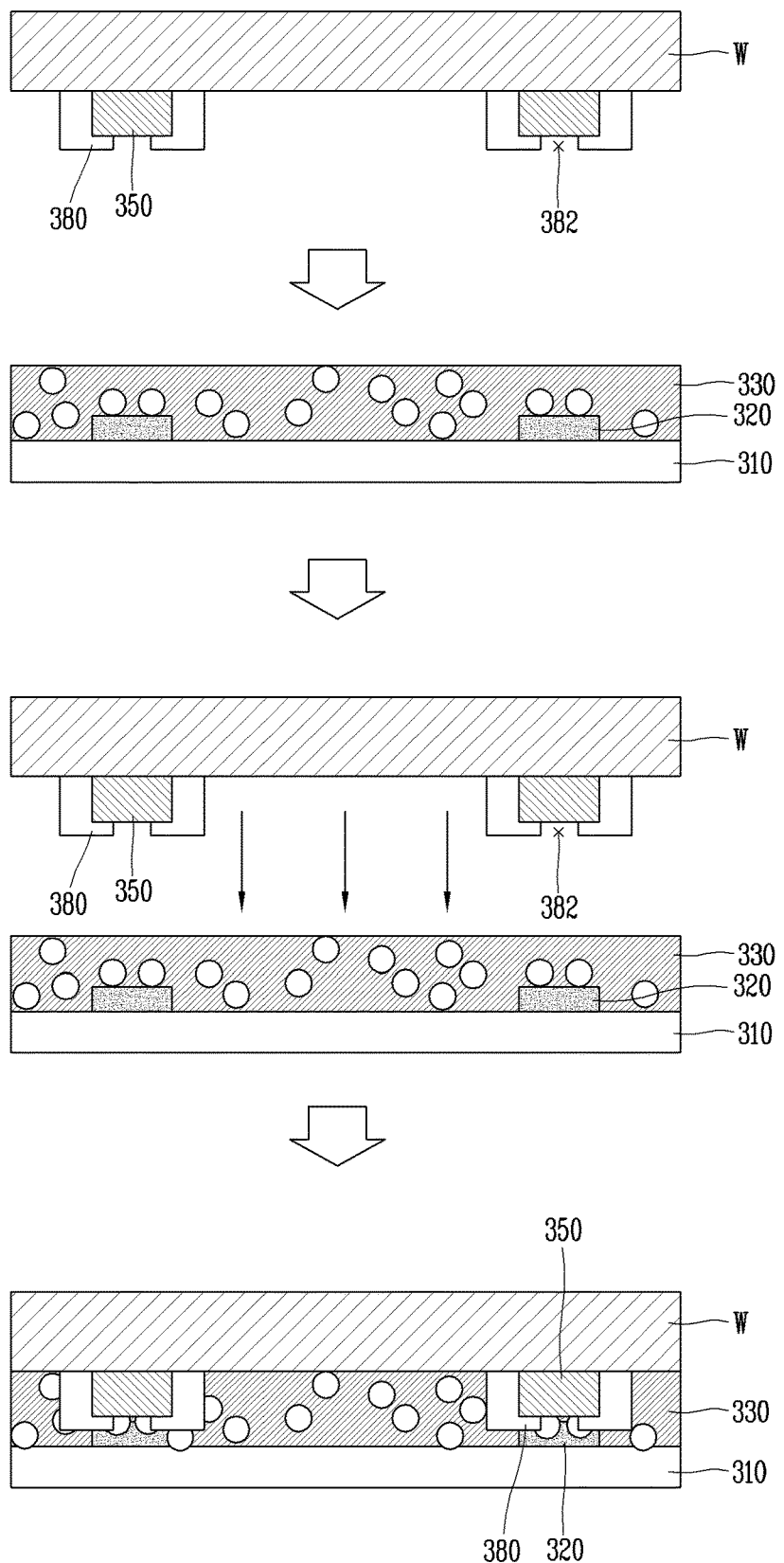
FIG. 15 is a conceptual view showing a method of manufacturing a display device according to the present disclosure.

FIG. 15 is a conceptual view showing a method of manufacturing a display device according to the present disclosure.

Referring to the drawing, a step of forming a plurality of semiconductor light-emitting elements on a transfer substrate (W) is carried out. When the semiconductor light-emitting element 350 formed on a wafer is directly transferred to a wiring board, the wafer itself may become a transfer substrate. On the contrary, when a semiconductor light-emitting element formed on a wafer is primarily transferred to an intermediate substrate and then transferred to a wiring board, the intermediate substrate becomes a transfer substrate.

Then, a step of forming the buffer portion 380 covering the semiconductor light-emitting elements is carried out. At this time, the buffer portion 380 includes at least one hole 382 to allow a portion of each of the semiconductor light-emitting elements 350 to be exposed to the outside.

The hole 382 must be formed in a region of the semiconductor light-emitting element 350 where a conductive electrode is formed. In order for the conductive electrode to be electrically connected to the wiring electrode 320, the conductive electrode must be exposed to the outside.

Next, a step of forming the wiring electrode 320 on a substrate different from the transfer substrate (W) and forming the anisotropic conductive layer 330 on the substrate on which the wiring electrode 320 is formed is carried out.

Finally, a step of compressing the transfer substrate (W) to the substrate 310 is carried out. At this time, the buffer portion 380 formed on the transfer substrate (W) pressurizes the anisotropic conductive layer 330, and a material forming the anisotropic conductive layer 330 flows into the hole 382. Conductive particles flowing into the hole 382 are compressed between the semiconductor light-emitting element 350 and the wiring electrode 320. The buffer portion 380 allows a predetermined number or more conductive particles to be disposed between the semiconductor light-emitting element 350 and the wiring electrode 320 during thermal compression.

The wiring electrode 320 formed on the substrate 310 may include a plurality of line electrodes arranged side by side at a predetermined interval, but the buffer portions 380 are arranged side by side at predetermined intervals to overlap with the plurality of line electrodes after thermal compression.

When the buffer portions 380 are arranged at the same interval as that between the line electrodes and then thermally compressed, a material forming the anisotropic conductive layer 330 may flow into a space between the buffer portions 380. Since the space between the buffer portions 380 serves as a channel through which the anisotropic conductive layer 330 can flow, even when the anisotropic conductive layer 330 is formed with an uneven thickness on the wiring board 310, uniform pressure may be applied to the wiring board 310 during thermal compression.

The configurations and methods according to the above-described embodiments will not be applicable in a limited way to the foregoing display device using a semiconductor light-emitting element, and all or part of each embodiment may be selectively combined and configured to make various modifications thereto.

What is claimed is:

1. A display device, comprising:
   a substrate;
   a wiring electrode disposed on the substrate;
   a plurality of semiconductor light-emitting elements electrically connected to the wiring electrode;
   an anisotropic conductive layer disposed between the plurality of semiconductor light-emitting elements and formed of a mixture of conductive particles and an insulating material; and
   a buffer portion disposed on a lower surface of the plurality of semiconductor light-emitting elements, the buffer portion being provided with a plurality of holes,
   wherein the mixture of the conductive particles and the insulating material is disposed inside the plurality of holes,
   wherein the wiring electrode is electrically connected to the plurality of semiconductor light-emitting elements through the conductive particles disposed inside the plurality of holes,
   wherein the buffer portion further comprises a protruding portion extending from one end in a thickness direction of the plurality of semiconductor light-emitting elements, and disposed on a side surface of the plurality of semiconductor light-emitting elements, and
   wherein a first thickness of a portion of the buffer portion disposed on the lower surface of the plurality of semiconductor light-emitting elements is less than a second thickness of the protruding portion of the buffer portion disposed on the side surface of the plurality of semiconductor light-emitting elements, so as to allow the wiring electrode and the plurality of semiconductor light-emitting elements to be spaced apart by a predetermined distance at the lower surface of the plurality of semiconductor light-emitting elements by the first thickness and to allow the protruding portion to increase light extraction efficiency or induce total reflection of light at the side surface of the plurality of semiconductor light-emitting elements by the second thickness.

2. The display device of claim 1, wherein the plurality of holes are disposed to overlap with the lower surface of the plurality of semiconductor light-emitting elements.

3. The display device of claim 1, wherein the protruding portion is formed of a light-transmitting material.

4. The display device of claim 1, wherein the protruding portion is formed of a white material.

5. The display device of claim 1, wherein the wiring electrode includes a plurality of line electrodes arranged parallel to each other, and
   wherein the buffer portion is disposed along each of the plurality of line electrodes.

6. The display device of claim 1, wherein a portion of the wiring electrode is positioned in the plurality of holes.

7. The display device of claim 1, wherein the buffer portion is formed at the plurality of semiconductor light-emitting elements, and at locations extending between the plurality of semiconductor light-emitting elements over the wiring electrode.

8. The display device of claim 1, wherein the buffer portion disposed between the plurality of semiconductor light-emitting elements overlaps the wiring electrode and extends parallel to a longitudinal direction of the wiring electrode.

9. The display device of claim 1, wherein at least one of the conductive particles is interposed between the portion of the buffer portion and the substrate at a location outside a hole of the plurality of holes of the buffer portion.

10. A method of manufacturing a display device by transferring a plurality of semiconductor light-emitting elements to a substrate on which a wiring electrode is formed, the method comprising:
    locating the plurality of semiconductor light-emitting elements on a transfer substrate;
    forming a buffer portion having the plurality of holes on the plurality of semiconductor light-emitting elements to allow a portion of the plurality of semiconductor light-emitting elements to be exposed to the outside;
    forming an anisotropic conductive layer formed of a mixture of conductive particles and an insulating material on the substrate on which the wiring electrode is formed; and
    compressing the transfer substrate to the substrate,
    wherein the wiring electrode is electrically connected to the plurality of semiconductor light-emitting elements through at least one of the conductive particles disposed inside the plurality of holes,
    wherein the buffer portion includes a portion disposed on a lower surface of the plurality of semiconductor light-emitting elements, and a protruding portion extending from one end in a thickness direction of the plurality of semiconductor light-emitting elements and disposed on a side surface of the plurality of semiconductor light-emitting elements, and
    wherein a first thickness of the portion of the buffer portion disposed on the lower surface of the plurality of semiconductor light-emitting elements is less than a second thickness of the protruding portion of the buffer portion disposed on the side surface of the plurality of semiconductor light-emitting elements, so as to allow the wiring electrode and the plurality of semiconductor light-emitting elements to be spaced apart by a predetermined distance at the lower surface of the plurality of semiconductor light-emitting elements by the first thickness and to allow the protruding portion to increase light extraction efficiency or induce total reflection of light at the side surface of the plurality of semiconductor light-emitting elements by the second thickness.

11. The method of claim 10, wherein the wiring electrode comprises a plurality of line electrodes, and
    wherein the buffer portion is disposed along each of the plurality of line electrodes.

12. The method of claim 11, wherein a plurality of buffer portions include the buffer portion, and
wherein, in the compressing of the transfer substrate to the substrate, the plurality of buffer portions are disposed at predetermined intervals to allow the anisotropic conductive layer to flow between the plurality of buffer portions.

13. The method of claim 10, wherein the compressing of the transfer substrate to the substrate is performed until the buffer portion is brought into contact with the wiring electrode.

14. The method of claim 13, wherein a portion of the wiring electrode is positioned in the plurality of holes.

15. The method of claim 10, wherein the buffer portion is formed at the plurality of semiconductor light-emitting elements, and at locations extending between the plurality of semiconductor light-emitting elements over the wiring electrode.

16. A display device, comprising:
a wiring electrode disposed on a substrate;
a plurality of semiconductor light-emitting elements electrically connected to the wiring electrode;
an anisotropic conductive layer disposed between the plurality of semiconductor light-emitting elements and formed of a mixture of conductive particles and an insulating material; and
a buffer portion disposed to enclose the plurality of semiconductor light-emitting elements and having a plurality of holes that individually correspond to the plurality of semiconductor light-emitting elements,
wherein the anisotropic conductive layer is disposed in the plurality of holes, and the conductive particles are in direct contact with the plurality of semiconductor light-emitting elements and the wiring electrode in the plurality of holes,
wherein the buffer portion includes a portion disposed on a lower surface of the plurality of semiconductor light-emitting elements, and a protruding portion extending from one end in a thickness direction of the plurality of semiconductor light-emitting elements and disposed on a side surface of the plurality of semiconductor light-emitting elements, and
wherein a first thickness of the portion of the buffer portion disposed on the lower surface of the plurality of semiconductor light-emitting elements is less than a second thickness of the protruding portion of the buffer portion disposed on the side surface of the plurality of semiconductor light-emitting elements, so as to allow the wiring electrode and the plurality of semiconductor light-emitting elements to be spaced apart by a predetermined distance at the lower surface of the plurality of semiconductor light-emitting elements by the first thickness and to allow the protruding portion to increase light extraction efficiency or induce total reflection of light at the side surface of the plurality of semiconductor light-emitting elements by the second thickness.

17. The display device of claim 16, wherein the buffer portion is located on a lateral surface and a portion of a lower surface of the plurality of semiconductor light emitting elements.

18. The display device of claim 16, wherein the protruding portion is formed of one of a light-transmitting material and a white material.

19. The display device of claim 16, wherein a portion of the wiring electrode is positioned in the hole for the plurality of semiconductor light-emitting elements.

* * * * *